United States Patent
Heyl

(10) Patent No.: US 8,198,137 B2
(45) Date of Patent: Jun. 12, 2012

(54) LEAD FRAME ISOLATION USING LASER TECHNOLOGY

(76) Inventor: Jon Heyl, Orlando, FL (US)

( * ) Notice: Subject to any disclaimer, the term of this patent is extended or adjusted under 35 U.S.C. 154(b) by 956 days.

(21) Appl. No.: 12/084,444

(22) PCT Filed: Jun. 30, 2006

(86) PCT No.: PCT/US2006/025646
§ 371 (c)(1),
(2), (4) Date: May 1, 2008

(87) PCT Pub. No.: WO2007/005639
PCT Pub. Date: Jan. 11, 2007

(65) Prior Publication Data
US 2009/0223942 A1 Sep. 10, 2009

Related U.S. Application Data

(60) Provisional application No. 60/695,480, filed on Jun. 30, 2005.

(51) Int. Cl.
H01L 35/34 (2006.01)

(52) U.S. Cl. ........................................ 438/111

(58) Field of Classification Search .......... 219/121.67–121.69, 121.72, 121.77, 219/121.83; 438/111, 123; 257/666
See application file for complete search history.

(56) References Cited

U.S. PATENT DOCUMENTS

| | | | | |
|---|---|---|---|---|
| 3,463,898 A * | 8/1969 | Okabe et al. | ............. | 219/121.63 |
| 4,608,480 A * | 8/1986 | Bizot et al. | ................. | 219/121.7 |
| 4,671,660 A * | 6/1987 | Distl et al. | .................... | 356/367 |
| 4,978,830 A * | 12/1990 | Millerick et al. | ........ | 219/121.67 |
| 4,985,988 A * | 1/1991 | Littlebury | ........................ | 438/15 |
| 5,539,719 A * | 7/1996 | Motoi | ......................... | 346/107.1 |
| 5,632,083 A * | 5/1997 | Tada et al. | ......................... | 29/827 |
| 5,662,822 A * | 9/1997 | Tada et al. | ................ | 219/121.67 |
| 6,720,195 B2 * | 4/2004 | Jensen | ............................ | 438/15 |
| 6,724,213 B2 * | 4/2004 | Ito et al. | .................... | 324/756.07 |
| 6,760,054 B1 * | 7/2004 | Okuyama | ..................... | 347/234 |
| 6,777,265 B2 * | 8/2004 | Islam et al. | .................... | 438/111 |
| 6,787,392 B2 * | 9/2004 | Quah | ............................ | 438/112 |
| 6,808,117 B2 * | 10/2004 | Han et al. | ...................... | 235/494 |
| 6,821,472 B2 * | 11/2004 | Schreiner et al. | ............. | 264/400 |
| 6,872,599 B1 * | 3/2005 | Li et al. | ........................ | 438/123 |

FOREIGN PATENT DOCUMENTS

JP 03015790 A * 1/1991

* cited by examiner

*Primary Examiner* — Samuel M Heinrich
(74) *Attorney, Agent, or Firm* — Daniel Law Offices, P.A.; Jason T. Daniel, Esq.

(57) ABSTRACT

Systems and methods for electrically isolating conductive members on an array of lead frames. In one embodiment, a system includes a stage for positioning the array to receive laser radiation, a computer system and electro-optical components. The system can sever conductive members from one another by laser ablation effected with programmable scanning of light from a laser. Software effects ablation paths along a plurality of lines across the array of lead frames. In a related method, the array is of a specified design and of the type formed on a sheet having a plurality lead frames interconnected through integrally formed dam bars. Reference information is provided to describe geometric or dimensional features, including predefined laser ablation scan paths for performing cuts along predefined cut lines on each lead frame. The cut lines are specific to the lead frame array design. Fiducial markings are located on the sheet. Laser ablation is performed to cut conductive members along the predefined cut lines, thereby completely severing at least some of the conductive members from an associated dam bar.

15 Claims, 15 Drawing Sheets

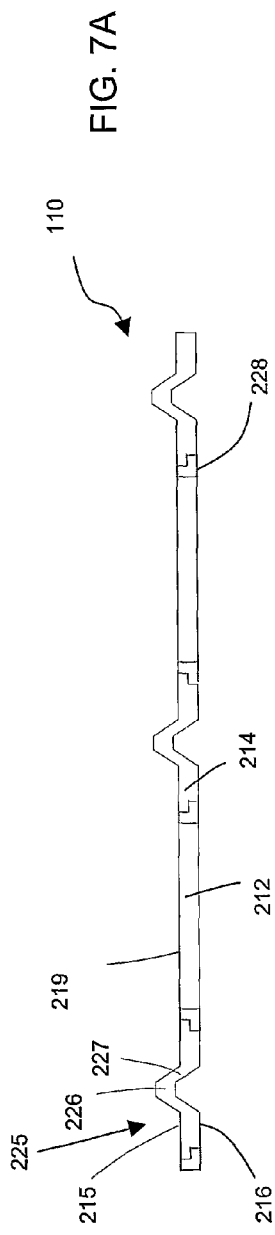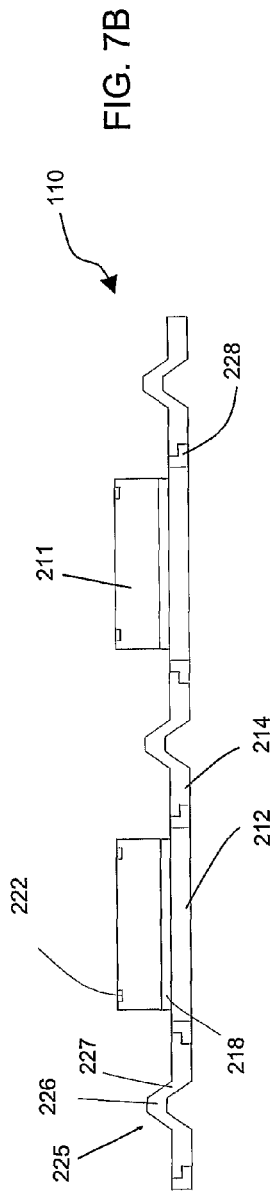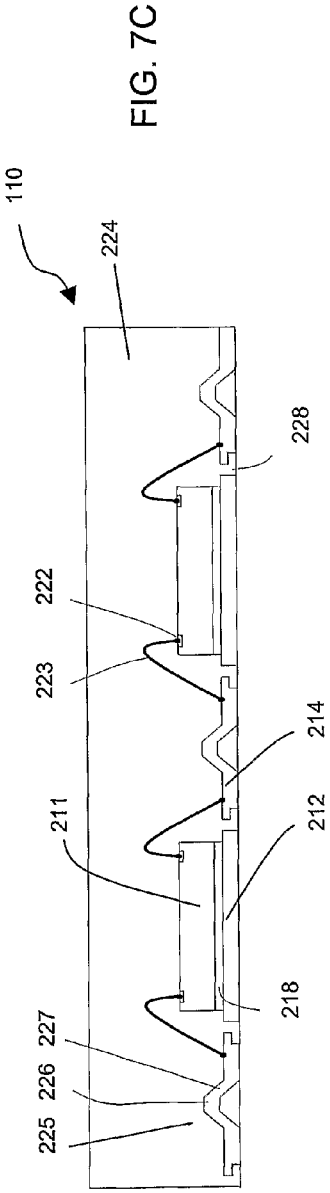

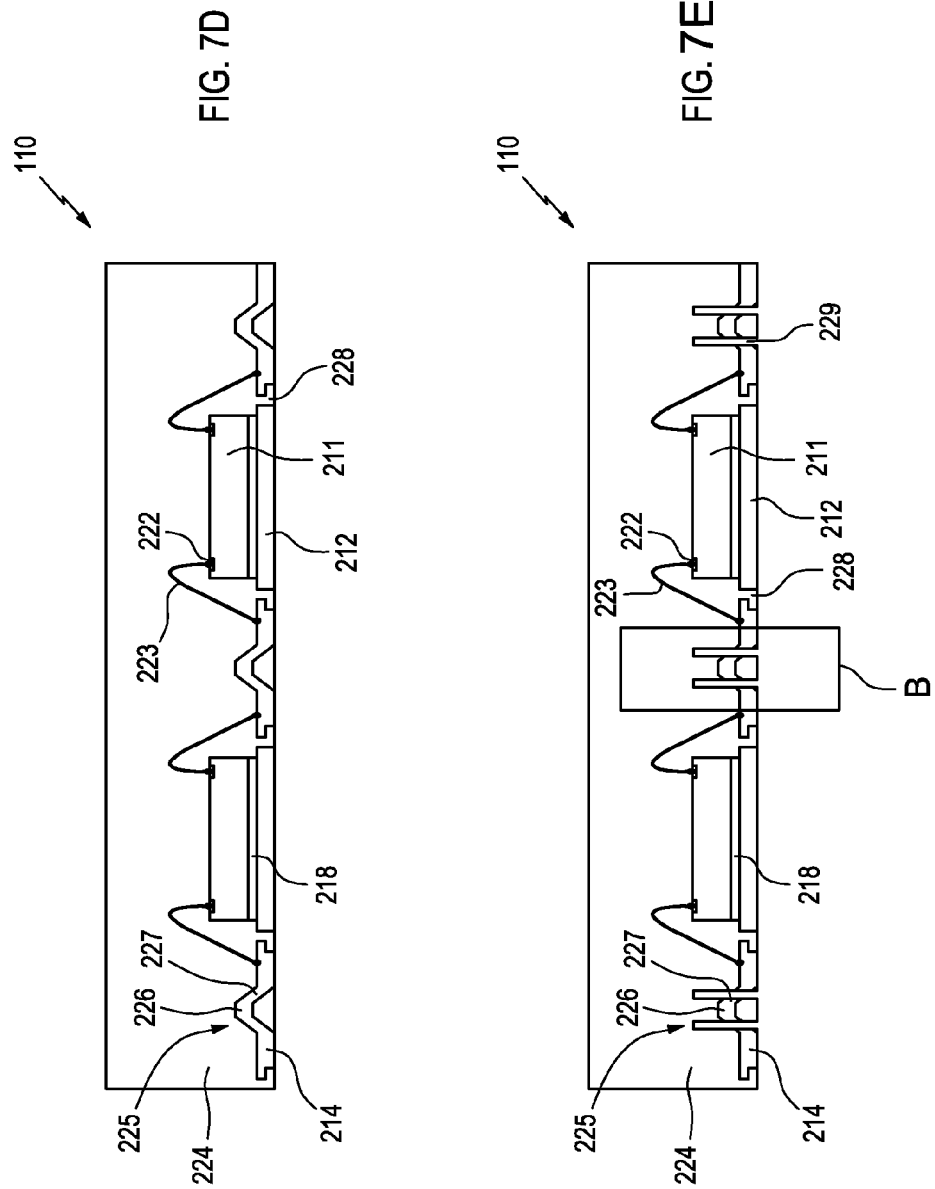

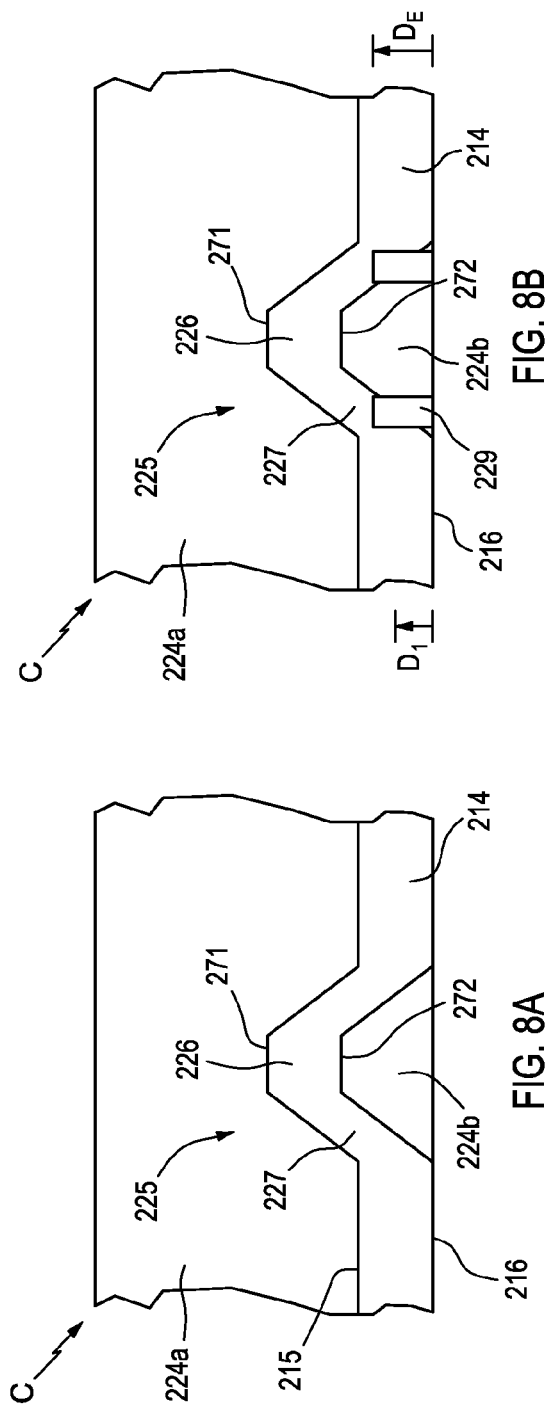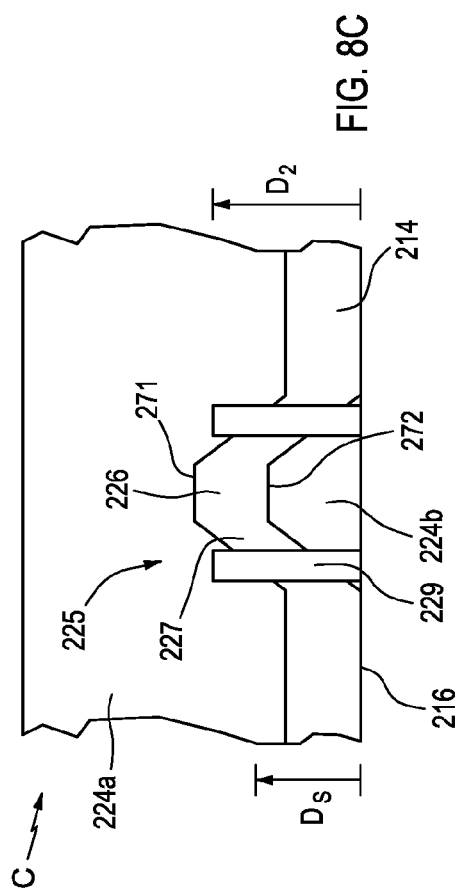

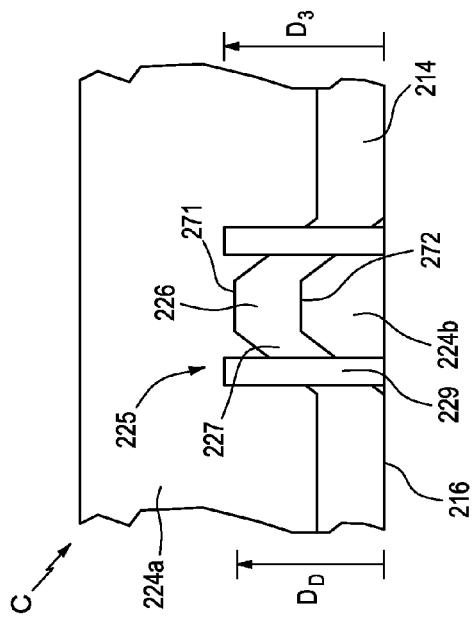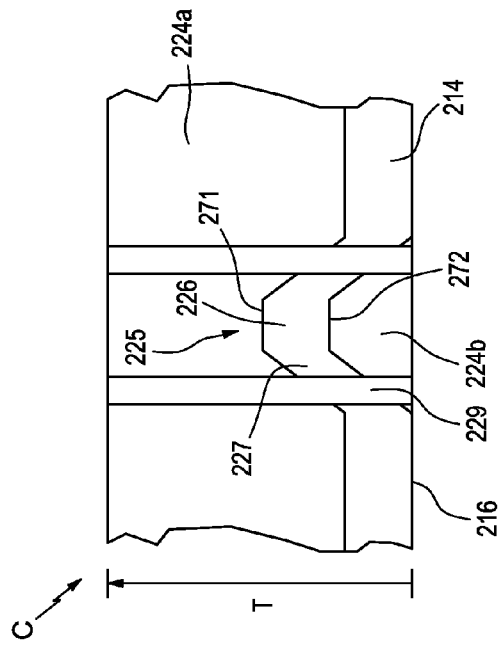

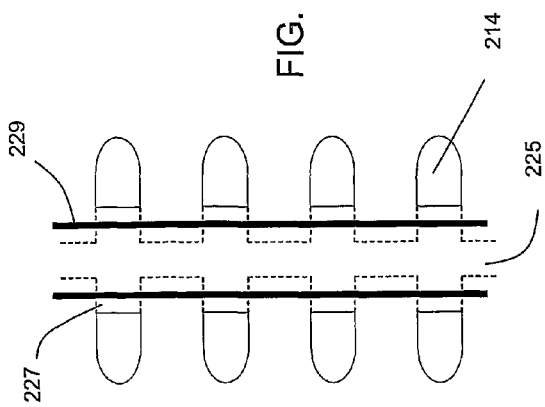
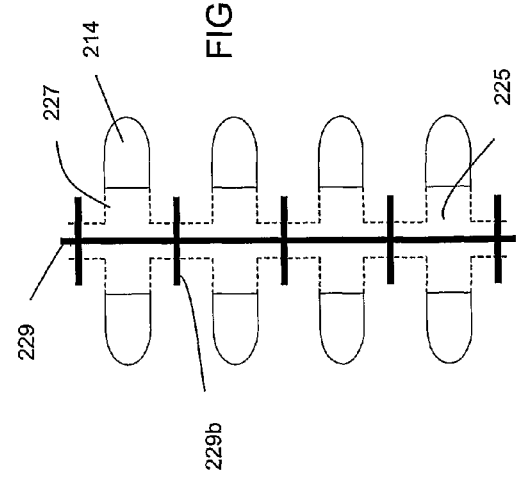
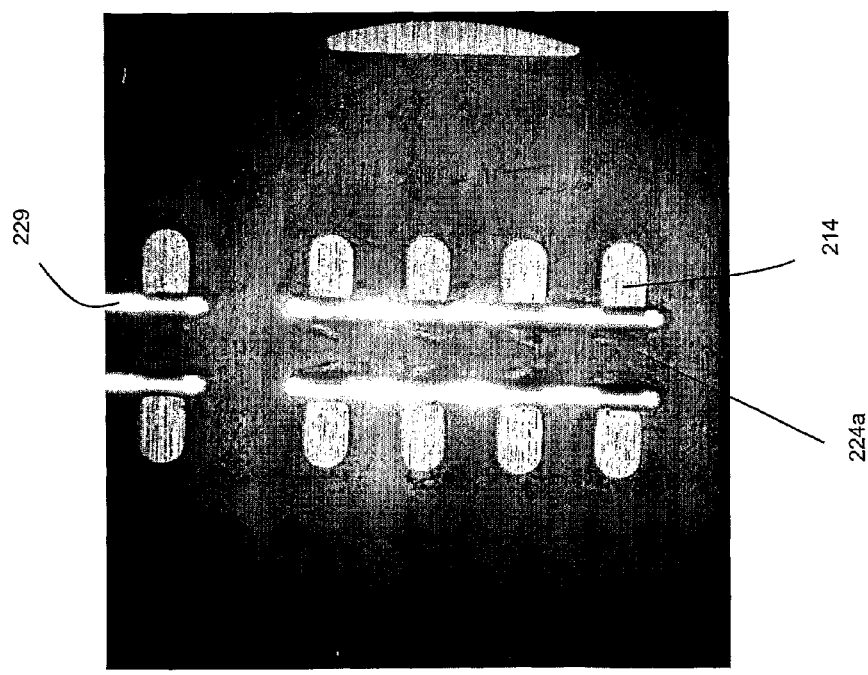
FIG. 9B
FIG. 9C
FIG. 9A

LEAD FRAME ISOLATION USING LASER TECHNOLOGY

RELATED APPLICATIONS

This application claims priority to U.S. 60/695,480 filed Jun. 30, 2005, which is hereby incorporated by reference in its entirety.

FIELD OF INVENTION

This invention relates generally to the field of microelectronics, and more particularly to methods and systems for effecting the electrical isolation of semiconductor devices while mounted on lead frame strips.

BACKGROUND OF THE INVENTION

In the semiconductor industry the packaging of microelectronic components conventionally involves placement of electronic devices, or dies, on lead frames prior to encapsulation in protective package material. Lead frames are typically formed in arrays on metal strips or plates. A stamping process creates a matrix of lead frames, each including a die attachment site and package conductors, commonly package leads, to effect electrical communication with, for example, other components on a printed wiring board (PWB). A die is attached to each attachment site with an adhesive or soldering process. Wire bonding is then used to form electrical connections from the active die pads of each die to the package conductors. Plastic is injection-molded around the die and lead frame to form the typical black plastic body.

In the case of mounting more expensive or elaborate die, lead frame strips are constructed by perforating metal sheets typically ranging between 1.5 and 3.0 inches in width. These strips are 6 to 10 inches long and a few mils in thickness. Lead frame materials include copper or copper alloys, a copper core plated with nickel, and a copper core covered with flash gold, palladium, or silver. Lead frame strips may contain arrays of up to 100 or more mounting sites.

Demands for increasing the density of circuit functions on printed wiring boards are resulting in smaller and thinner integrated circuit packages. This is especially true for lead-frame devices having a low number of leads, e.g., 10 or fewer. Small profiles, such as available in the format of Quad-Flat Non-leaded (QFN) packaged devices, provide very short connection distances between the die and the lead frame conductors to achieve optimal electrical and thermal performance. These are suitable for performance up to 12 GHz, including applications in analog, RF, and mixed signal circuitry. They are often placed in wireless or handheld electronic systems such as phones, digital cameras and PDA's, where size and weight are important performance factors.

With this trend toward a near Chip Size Package (CSP), packages with 1 mm by 2 mm dimensions or less are now common, and the progression is toward even smaller sizes. Cost-effective volume production of these micro-packaged products is large, often on the order of a million parts or more per day at a single manufacturing facility. Consequently there is continued need to address cost, yield and throughput issues as device sizes continue to shrink. By testing devices in parallel and at greater rates, throughput can be optimized. With larger package sizes, this has been effected with Test Before Singulation (TBS) processes, i.e., testing of devices prior to singulation from the lead frame strip, at speeds on the order of 0.3 second per device. However, it becomes problematic to implement TBS processes as the dimensions of CSP packages become smaller. Special features must be incorporated to accommodate conventional TBS processes, e.g., sawing or etching, and to avoid damage to the devices.

When testing is performed after singulation, throughput test speeds can be less than one second per device. However, with the package leads having minimal contact dimensions, e.g., on the order of 0.15 mm, parts that are singulated and then socket tested may have lower first-pass yields than devices tested before singulation. This is attributable, in part, to alignment and orientation errors occurring in vision-based handling systems. For example, when systems place singulated parts in sockets, if the electrical contacts are not correct, then good parts are identified as failed.

It is preferred to have TBS processes which enable testing of more CSP devices in parallel and at higher rates than achievable when testing is performed after singulation. Even with specially designed lead frames and lead-isolation tooling, application of TBS processes to the smallest dimension CSP devices has been fraught with issues relating to cost, quality and alignment. It is a desire in the art to overcome these limitations because a TBS process could be used to further increase test throughput of CSP devices, e.g., by simultaneous test of multiple dies positioned in an array on a lead frame microstrip.

SUMMARY OF THE INVENTION

According to the invention, systems and methods are provided for electrically isolating conductive members on an array of lead frames. In one embodiment, a system for electrically isolating conductive members in a plurality of lead frames from one another enables performance of electrical tests on the lead frames prior to singulating the lead frames from one another. The lead frames are integrally formed in an array formed on a sheet. The system may include a stage for positioning the array to receive laser radiation, a laser, a computer system and electro-optical components. The system can sever conductive members from one another by laser ablation effected with programmable scanning of light from the laser. Software effects ablation paths along a plurality of lines across the array of lead frames. In one example, the ablation occurs in spaced-apart segments along lines oriented along a first direction to sever some of the leads from one another while leaving the lead frames attached to one another, and in spaced-apart segments along lines oriented along a second direction not parallel with the first direction to sever others of the leads from one another. The software enables cutting of conductive members from one another without singulating the lead frames from one another so that the array can undergo electrical testing prior to singulation.

In a related method for electrically isolating conductive members in a lead frame array from one another, the array is of a specified design and of the type formed on a sheet having a plurality lead frames interconnected through integrally formed dam bars. Reference information is provided to describe geometric or dimensional features, including predefined laser ablation scan paths for performing cuts along predefined cut lines on each lead frame. The cut lines are specific to the lead frame array design. Fiducial markings are located on the sheet. Laser ablation is performed to cut conductive members along the predefined cut lines, thereby completely severing at least some of the conductive members, each from an associated dam bar, thereby electrically isolating conductive members on one lead frame from conductive members on another lead frame.

There is also provided a method for electrically isolating conductive members formed on each side of a dam bar to perform an electrical test on at least some of the lead frames prior to singulating the lead frames. According to the method a laser is applied to cut through a first dam bar in the first direction and cut through the first dam bar on each side of each associated conductive member.

In still another embodiment, a method for electrically isolating conductive members in a lead frame array from one another includes providing reference information describing geometric or dimensional features, including predefined laser ablation scan paths for performing cuts along predefined cut lines on each lead frame. The cut lines are specific to the lead frame array design. Fiducial markings are located on the sheet. A determination is made whether to apply the predefined laser ablation scan paths to effect cuts along the predefined cut lines by comparing relative positions of the fiducial markings to the reference information. The scan paths may be adjusted based on the extent of deviation between the relative positions and the reference information.

BRIEF DESCRIPTION OF THE DRAWINGS

The invention will be more clearly understood from the following detailed description of exemplary embodiments when read in conjunction with the drawings, wherein:

FIGS. 7A-7E are partial cross sectional views of a lead frame panel during stages of package fabrication according to the invention;

FIGS. 8A-8E are cross sectional views of a lead frame dam bar during stages of isolation cut according to the invention;

FIG. 9A is an image of a region of a dam bar area after isolation cuts are made through the whole thickness;

FIGS. 9B and 9C illustrate isolation cut methods according to the invention;

Like reference numbers are used to reference like features among the figures. Features presented in the figures are not drawn to scale.

DESCRIPTION OF THE EMBODIMENTS

Figure 1:
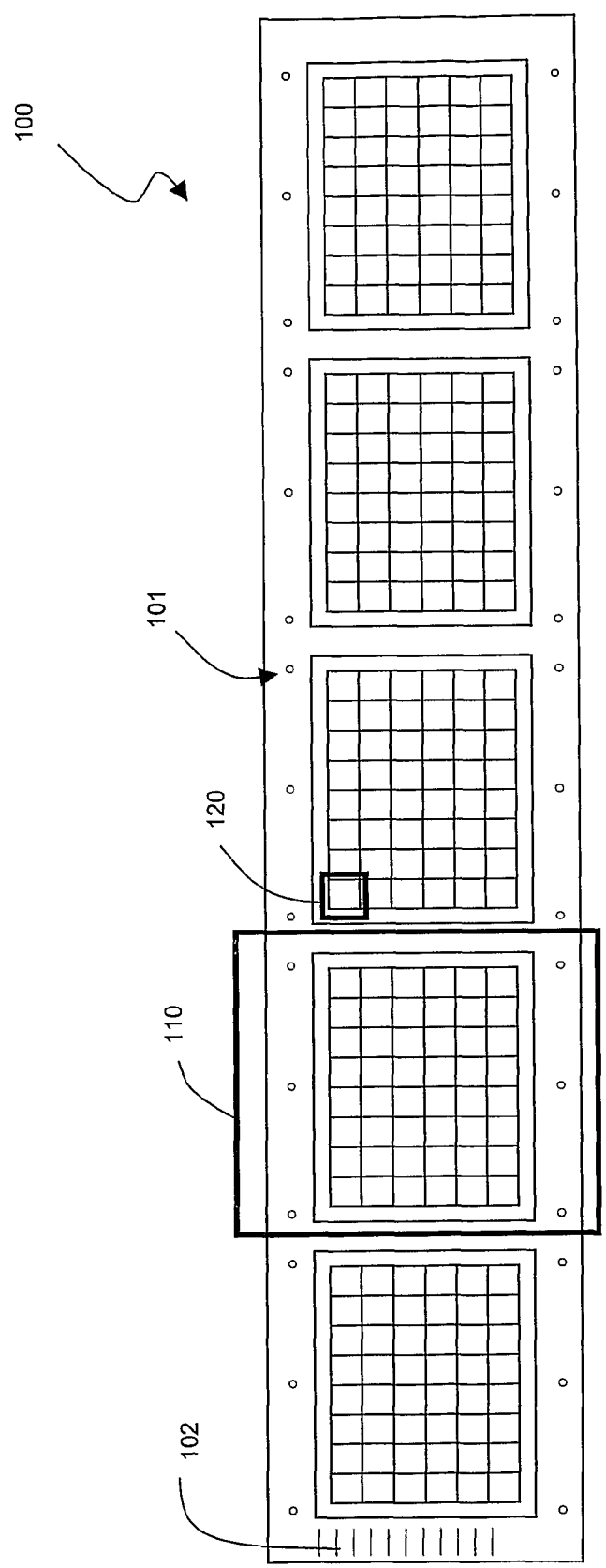
FIG. 1 illustrates an exemplary lead frame strip.
Figure 3:
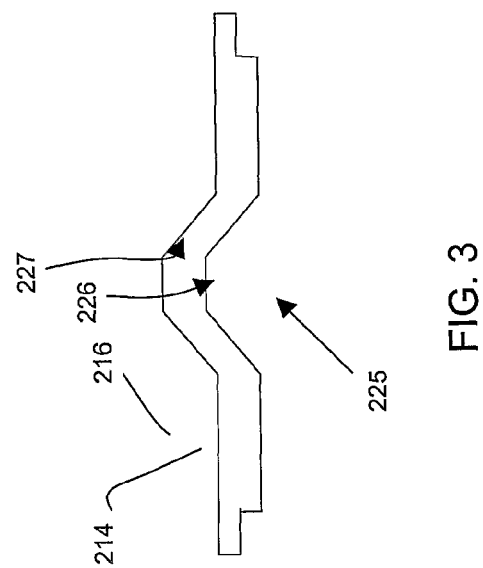
FIG. 3 is a partial cross sectional view taken within region A of FIG. 2.
Figure 2:
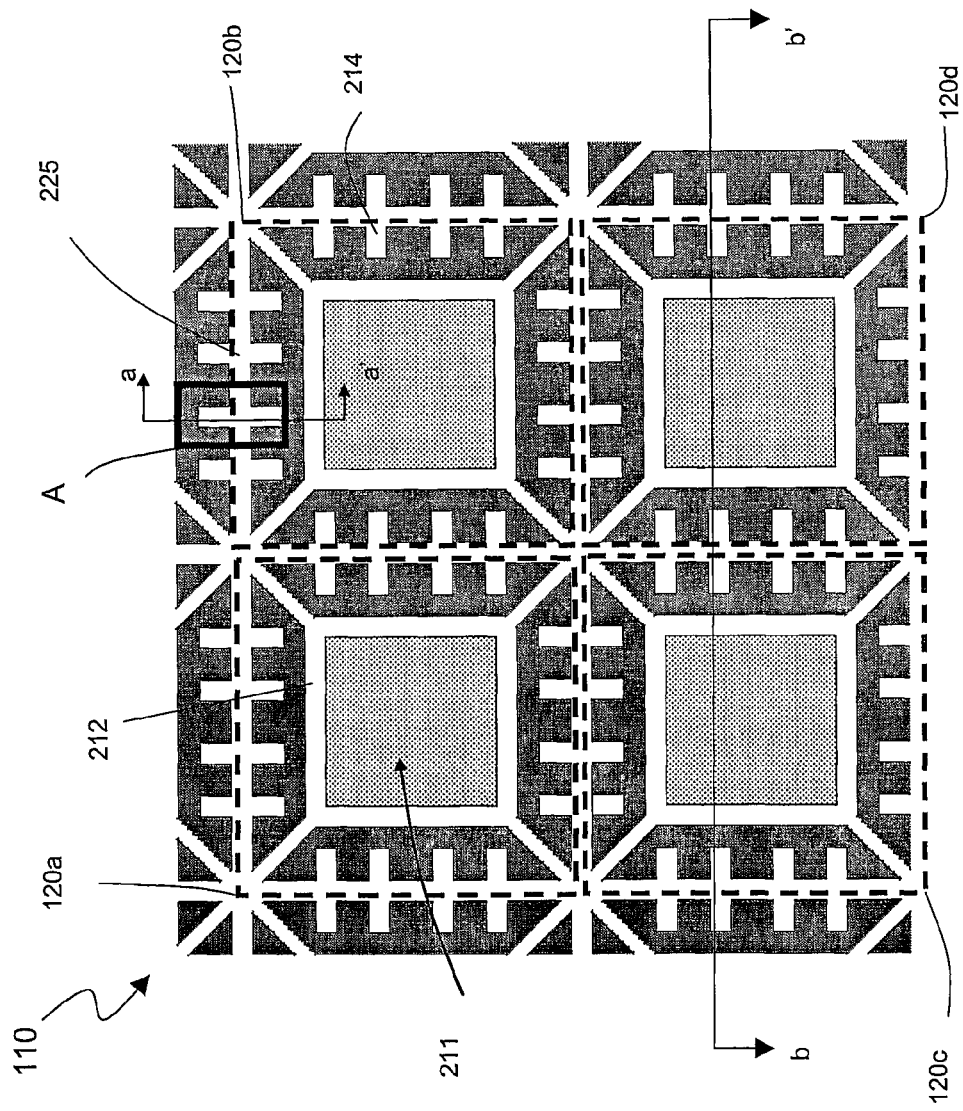
FIG. 2 illustrates a partial plan view of the lead frame strip shown in FIG. 1.

FIG. 1 illustrates a typical lead frame strip 100 comprising a plurality of lead frame panels 110, each containing an array of lead frames 120. Alignment holes 101 and bar code information 102 are also shown in FIG. 1. FIG. 2 illustrates four lead frames 120a, 120b, 120c, and 120d integrally formed next to one another in an array of a panel 110. Each lead frame 120 has a die 211 mounted on a central pad 212. The illustrated lead frames may be of a size suitable for conventional processes to effect TBS, i.e., electrical strip testing, or may be of considerably smaller size as to require electrical isolation according to the invention. Adjacent pairs of lead frames are interconnected by a dam bar 225. The dam bars 225 are integrally formed between conductive pads or leads, generally referred to herein as leads 214. The leads 214 on each side of a dam bar 225 are associated with a different one of the lead frames. With this arrangement, it has been conventional to use a saw to cut the dam bars 225 to electrically isolate the leads 214 on each side of the dam bar 225 from one another. This has enabled rapid electrical strip testing of the mounted dies after encapsulation and before singulation. FIG. 3 is an enlarged view in cross section within region A of FIG. 2, taken along line a-a' of FIG. 2. In this exemplary configuration the upper surfaces 216 of the leads 214 are all formed along the same plane. The dam bars 225 are generally formed below the plane of the surfaces 216, consisting of a flat portion 226 furthest below the surface 216 and two sloped portions 227, one on each side of the flat portion 226, each extending from the flat portion 226 up to the level of the leads 214.

Electrical isolation prior to strip testing is a routine process for many lead frame designs, especially large designs of the type having leads with a gull wing profile. With progression to CSP devices it has become difficult if not impossible to separate the dam bars 225 from the leads 214 with conventional saw technology. Even with incorporation of highly accurate pattern recognition systems, effects of warping, as well as expansion of the lead frame strip during the cutting operations, can limits on the ability to route a mechanical saw with proper alignment. Efforts to effect electrical isolation for TBS with electroless or etch processes have also had limited success.

As the package sizes become even smaller, alignment tolerances of the lead frame become more critical to perform acceptable electrical isolation cuts for TBS. Thus, tolerances associated with both the lead frame panels and the cutting process can present critical issues which impact yield. In order to achieve high package yields, the panel array alignment, cutting resolution and process margins must be sufficient for the minimum design rules. Further, the cutting operation cannot introduce defects such as micro-cracks, residues, or debris. The cutting process should be controllable in order to avoid costly rework.

With regard to alignment, control of electrical isolation cuts becomes more challenging at smaller dimensions because die attachment and encapsulation steps introduce additional thermal stresses to the lead frame strip which can cause significant bowing. In the past this has been tolerated by limiting the size of the lead frame arrays formed on individual panels 110. However, for the smaller quad flat no-lead lead frame devices with less than 500 micron lead pitch and lead length, the effects of thermal expansion and bowing on alignment of the a lead frame array cannot be addressed to accommodate a conventional sawing process.

In order to deliver a high throughput of acceptable isolation cuts, a tool must provide the combination of high cutting speed and an ability to compensate for misalignments of the panel array. The process must be highly automated to provide efficient handling of work-pieces and real-time monitoring to impart necessary corrections to the process.

According to an embodiment of the invention, laser ablation using a pulsed short wavelength laser beam can provide excellent quality cuts which generate only vapor debris, use no consumables, and do not cause any chips or micro-cracks in the cut edges.

An important parameter associated with performing an isolation cut is the resolution of the laser beam. The diffraction-free focus spot size is proportional to the light wavelength. For circular beams, the focal spot size is:

$$D_{min}=2.44f^*\lambda/D$$

where f is the lens focal length, $\lambda$ is the light wavelength, $D_{min}$ is the minimum unfocused beam diameter, the upper limit of laser processing precision at a specific wavelength. Thus for high precision applications, short wavelength lasers are preferred.

Another important performance criterion when applying laser ablation to perform an electrical isolation cut on a metal lead is the ability to control the Heat Affected Zone (HAZ). Generally, laser energy is first absorbed by electrons. The absorbed energy is then transferred to the lattice. Three characteristic time scales determine the volume of the heat affected zone. They are the electron cooling time ($T_e$), which is about 1 picosecond, the lattice heating time ($T_l$), and the duration of the laser pulse $T_l$. Te is much smaller than $T_l$. As $T_e$ and $T_i$ are material parameters, processes according to the invention vary $T_l$ to control lattice heating.

When $T_l$, is much longer than $T_i$, electron absorbed laser energy has enough time to be transferred to the lattice structure. The electron subsystem and the lattice structure can reach thermal equilibrium. Material is first melted, and if the rate of energy transfer is sufficiently high, evaporation occurs from the liquid state. The existence of a melted layer makes precise material removal using laser pulses above one nanosecond duration difficult.

On the other hand, when $T_l$ is much shorter than $T_e$ (e.g., when $T_l$ is of femosecond scale.), laser pulse duration is much shorter than the electron cooling time. Heated electrons transfer their energy to their positive lattice ions in picoseconds. Thus, with $T_l \ll T_e$, and sufficient power transfer, which is available with ultra-fast pulsed lasers, the lattice structure will receive sufficient power to break bonds in the lattice structure without significant transfer of energy to neighboring lattice ions. A direct solid-to-vapor transition can occur without significant generation of heat in the lattice structure, i.e., the heat affected zone is minimized. A transitional situation exists when $T_l$ is longer than $T_e$ but shorter than $T_i$ (e.g., $T_i$ being on the picosecond time scale.) allowing for a melting layer to exist during laser ablation.

Figure 4:
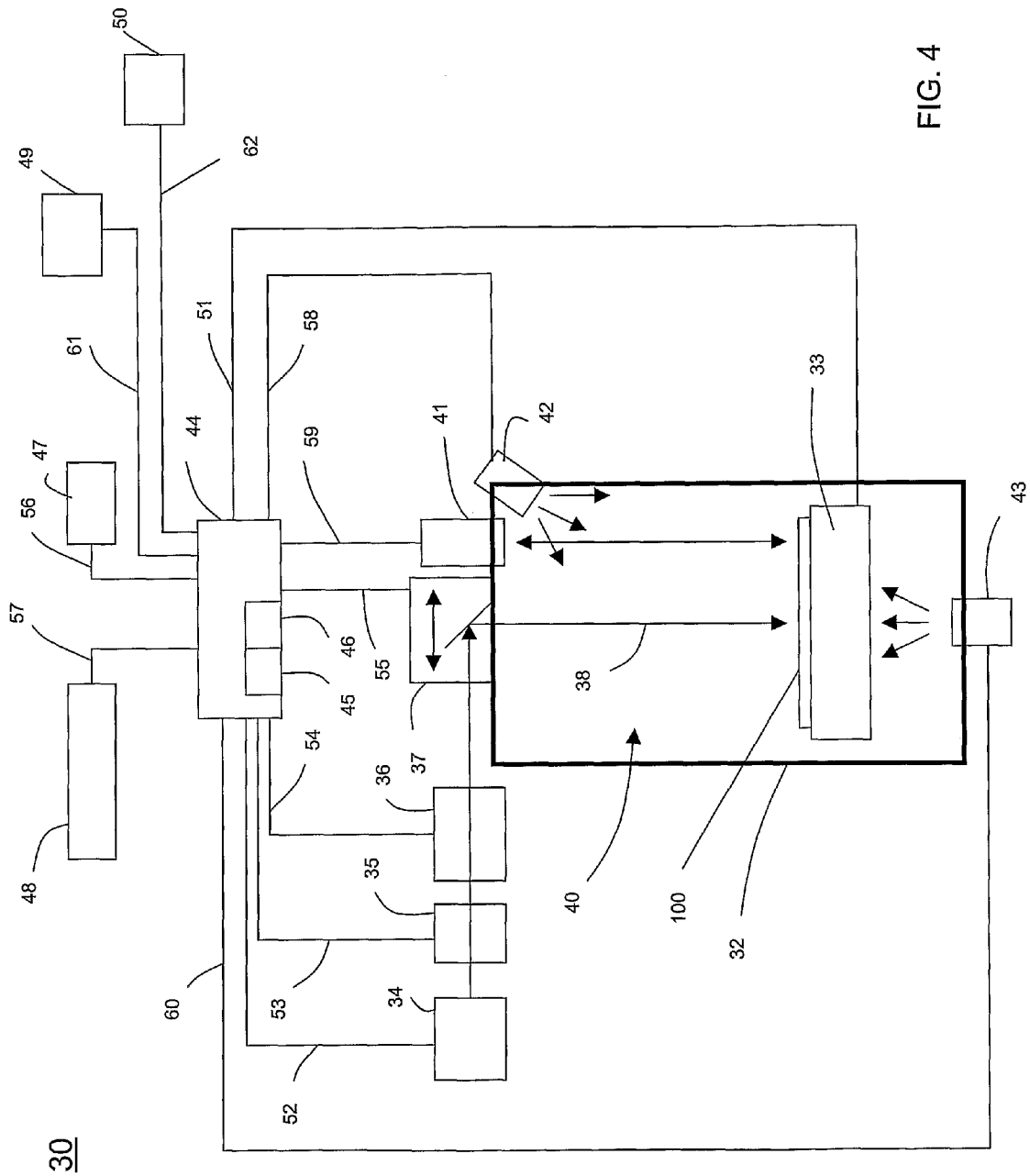
FIG. 4 illustrates in schematic form a system for electrical isolation of leads according to the invention.

In one embodiment of the invention, FIG. 4 illustrates a laser ablation system 30, suitable for both the electrical isolation of lead frame conductors on an encapsulated lead frame strip 100 and singulation of packaged die from a lead frame array. Generally, the system 30 includes a chamber 40, a laser 34; a beam shutter element 35; a beam focusing element 36; a laser beam scan head 37, for directing the energy beam toward the target device; a stage 33 for positioning and operating on a lead frame strip 100; a computer system 44 for controlling the operation of the system 30; and an operator interface which in this example comprises a graphic user interface (GUI) 47, a keyboard 49, and a mouse 50. The system 30 may also include an imaging element 41 with a plurality of sensors such as magnifying CCD cameras for inspection and alignment; a top illumination element 42 for chamber lighting; a bottom illumination element 43 for optical inspection; and a database interface 48 for importing related data such as lead frame strip geometry information needed for alignment and for laser ablation programming. Instructions for the interactive control of these various components of system 30 may be in the form of executable code resident in a memory 45, associated with the computer system 44, and under the control of an associated central processing unit (CPU) 46. The CPU may be a microprocessor or a digital signal processor.

A laser scan head 37 is mounted on the top wall 32 of the chamber 40. The laser beam scan head 37 includes electro-optic beam direction control components including a telecentric galvanometer providing a fixed focal length during scans in which the system 30 directs a laser beam 38 across the exposed surfaces of the encapsulated lead frame strip 100. The laser 34 may be any of a wide variety of laser types, such as a YAG or an infrared pulsed laser or even a CO2 laser. It is recognized that selection of the operating wavelength can affect speed and quality of the process such that the mechanisms of ablation and quality of laser cut will vary considerably. For high quality, precision cuts a deep ultraviolet wavelength laser, e.g., 193 nm, may be preferred. On the other hand, ablation efficiency may be more power effective in a wavelength range of 500-600 nm and more cost effective in an infrared range, e.g., 1064 nm.

The pulse frequency and power of the laser 34 may be adjusted for optimal removal of, for example, plastic encapsulant or conductor material, from the lead frame strip 100. In certain embodiments it is effective to use the same laser settings for the entire laser ablation process to electrically isolate leads 214 from one another.

With the interior of the chamber 40 illuminated by the element 42, operation of the laser beam 38 on the encapsulated lead frame strip 100 may be observed via the imaging element 41. The stage 33 is an X,Y positioning table positionable in a plane normal to the laser beam 38. As shown in FIG. 2, the substantially flat, encapsulated lead frame strip 100, when positioned on the stage 33, is disposed at substantially a normal angle to the angle at which the laser beam 38 is incident with the lead frame strip.

The system 30 may be manually operated, automatically operated or semi-automatically operated. For automatic and semiautomatic operation, with operating and applications software stored, e.g., on a fixed disc resident in the computer system 44, software is loaded into the memory 45 in order for the CPU 46 to control operations of the various components of the system 30 via control lines 51-62. The control lines that are connected to the stage 33, the laser 34, the beam shutter element 35, the beam focusing element 36, the beam scan head 37, the operator interface 47, the database interface 48, the image element 41, the top illumination element 42, the bottom illumination element 43, the keyboard 49, and the mouse 50.

Wavelengths in the range of 193 nm to 2 microns are suitable to perform electrical isolation of lead frame conductors which may be embedded in plastic molding compounds. As noted above, for high precision applications, short wavelength lasers are preferred. However, use of longer wavelength radiation, e.g., 1064 nm, can provide greater cutting speed although the quality of the cut may be diminished. However, the cut quality can be addressed during a subsequent lead frame singulation process performed with either a saw technique or with the laser-based cutting system such as the system 30.

Figure 5A:
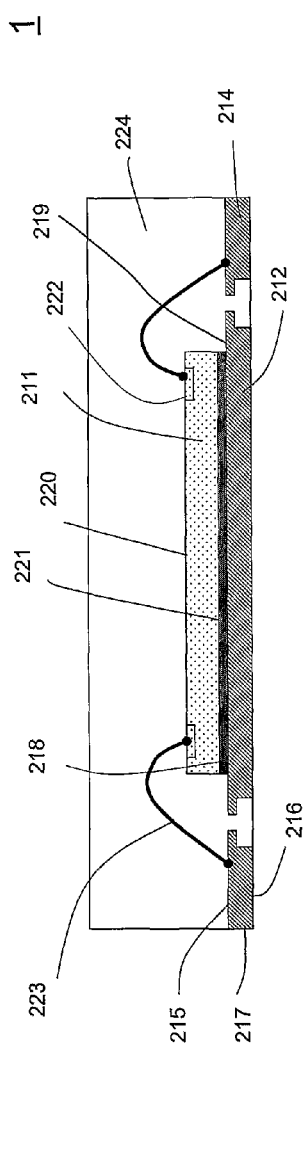
FIG. 5A is a cross sectional view of a semiconductor package.
Figure 5B:
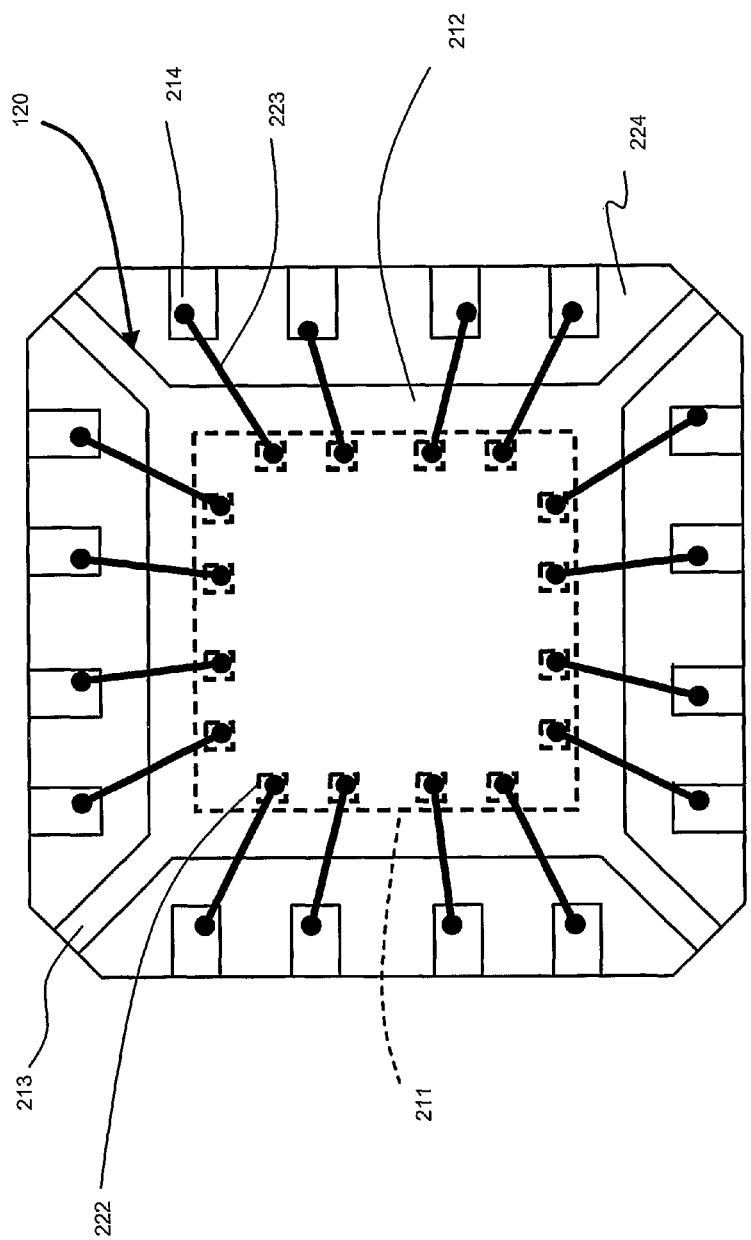
FIG. 5B is a plan view of the package shown in FIG. 5A.

FIG. 5A provides a view in cross-section of the die 211 formed in an exemplary QFN package 1 while FIG. 5B provides a plan view of the same device. The QFN package structure 1 is constructed on a lead frame 120 that includes a die pad 212 and a plurality of leads 214. The leads 214 each have a first surface 215, a second opposing surface 216 (corresponding to the upper surface 216 shown in FIG. C) and a side surface 217. The die 211, having an active surface 220 and a back surface 221, has the back surface 221 attached to a surface 219 of the die pad 212 with a die attachment material 218. A plurality of bond pads 222 formed on the active surface 220 are electrically connected to the leads 214 by bond wires 223. A molding compound 224 encapsulates the die 211, the die pad 212, the bond wires 223, the die pad tie bar 213, and the upper surfaces 215 of the leads 214. The surfaces 216 and 217 of the leads 214 remain exposed to effect electrical connections of the package 1.

Figure 6:
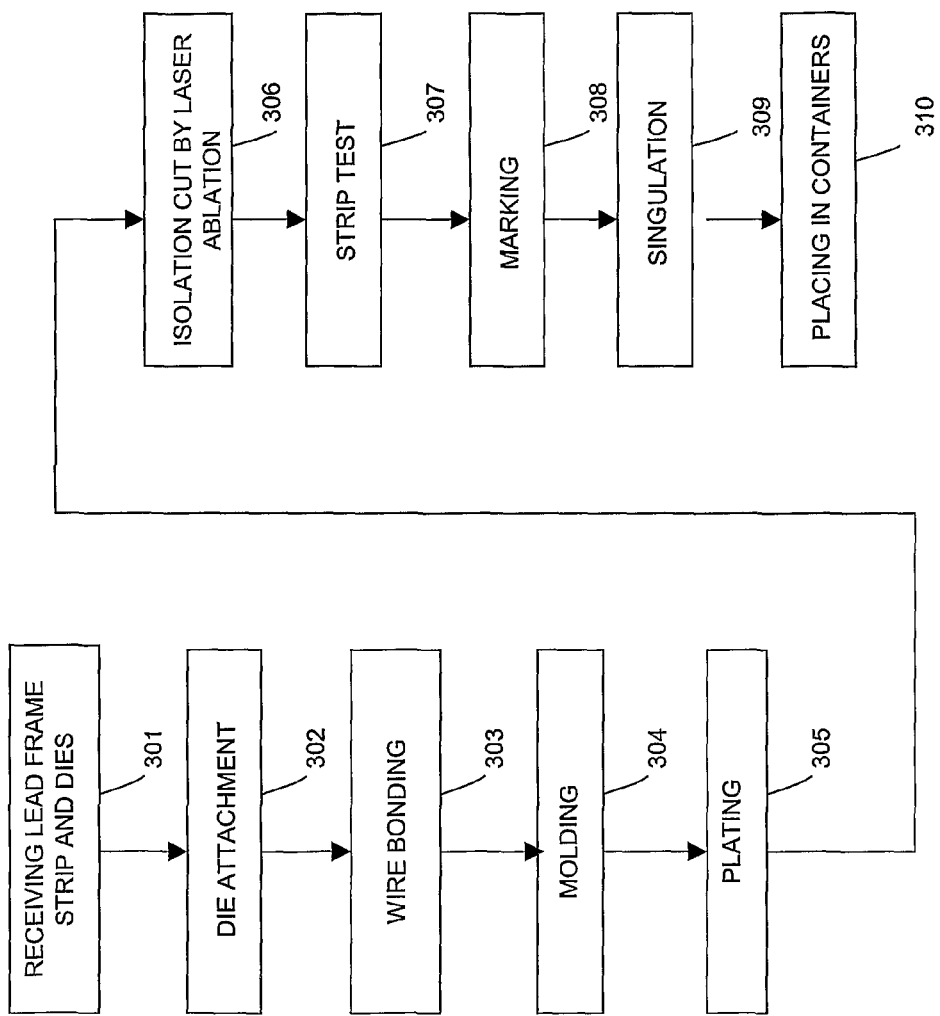
FIG. 6 is a flow chart illustrating the TBS process according to the invention.
Figure 13:
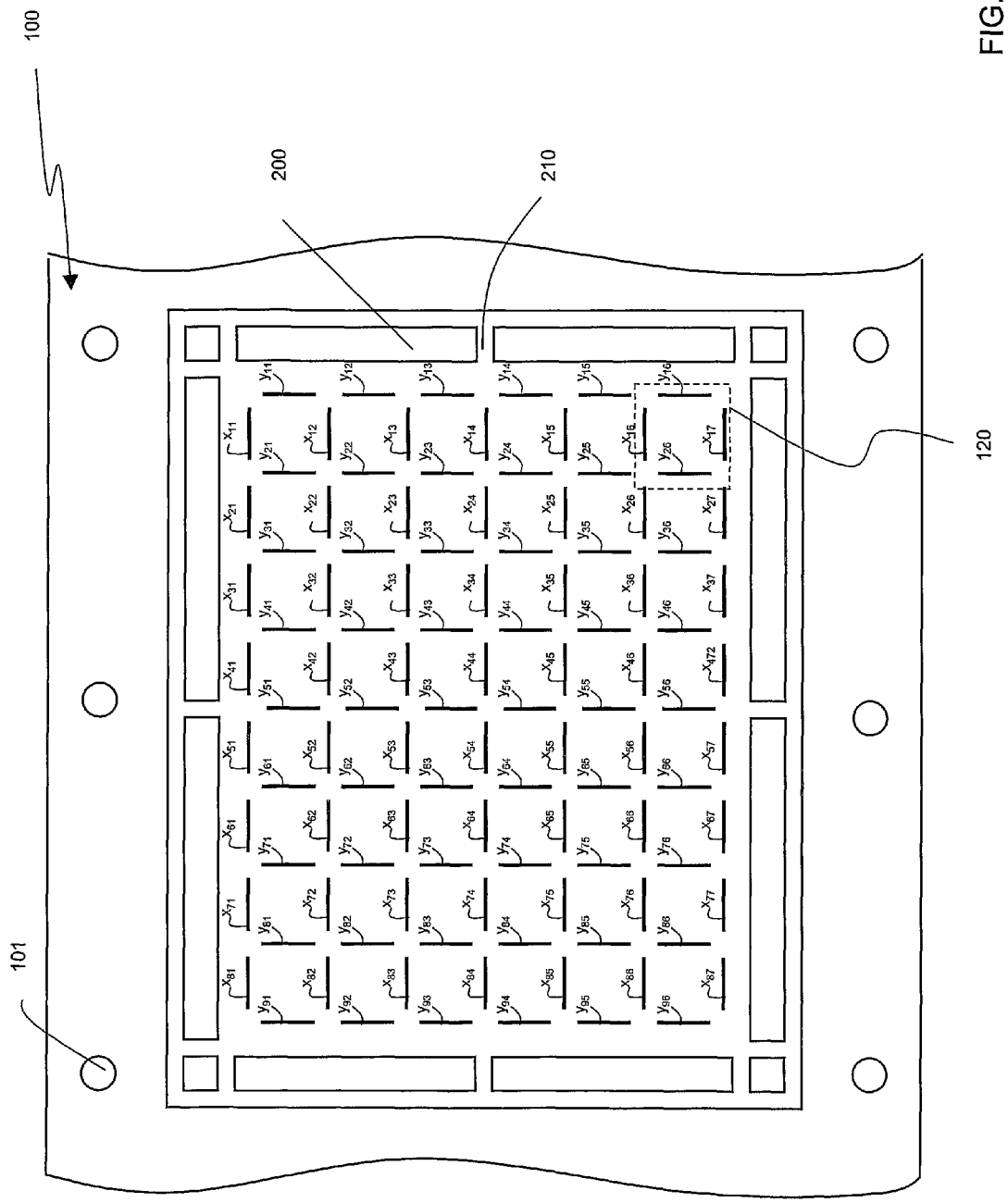
FIG. 13 illustrates an exemplary cut pattern in an array of lead frames.

Referring next to FIG. 6, a flow chart illustrates an exemplary method of fabricating semiconductor packages according to an embodiment of the present invention. In step 301 RECEIVING LEAD FRAME STRIP AND DIES, a lead frame strip 100 having at least one lead frame panel 110 in which a plurality of unit lead frames 120 are arranged in an array format of rows and columns and semiconductor dies 211 are provided. Next in step 302 DIE ATTACHMENT, a semiconductor die 211 is mounted to each die pad 212. In step 303 WIRE BONDING, bond wires 223 are electrically connected between each semiconductor die 211 and the leads 214 as shown in FIGS. 5A and 5B. In step 304 MOLDING, a molding process encapsulates the semiconductor die 211 and the lead frame 120. In step 305 PLATING, a plating process is performed to prepare the packages for mounting to a printed wiring board using, for example, a lead-free or standard Sn/Pb (tin/lead) solution. In step 306 ISOLATION CUT, in order to implement TBS strip testing, electrical isolation cuts are performed to sever each of the leads 214 joined to one another by dam bars 225. Accordingly, cuts are made along each edge of the dam bars 225. The scanning sequence of cuts is illustrated in FIG. 13. In step 307 STRIP TEST, with individual leads 214 electrically isolated from one another, a strip test process is performed to determine the functionality of each lead frame package. In step 308 MARKING, functional packages are marked. Then in step 309 SINGULATION, the encapsulated lead frame panel 110 is singulated into units of semiconductor packages along the dam bar by saw, punch or laser ablation with the system 30. In step 310 PLACING IN CONTAINERS, functional packages are then automatically placed in containers for shipment to customers. Steps 308 and 309 can be performed with the system 30 as a single operation, eliminating additional handling and further improving the throughput.

FIGS. 7A-7E illustrate, in partial plan views, die assembly on a lead frame 120 during a fabrication sequence in accord with the process flow of FIG. 6. In FIG. 7A, a part of lead frame panel 110 is shown with die pads 212, leads 214 and intervening slots 228 between each die pad 212 and illustrated leads 214. The flat portion 226 of the dam bar 225 is elevated relative to the surface 219 of the die pad 212 and the surfaces 215 of the leads 214. Sloped portions 227 of the dam bar 225 extend to the level of the lead surfaces 215 and 216. As shown in FIG. 7B, semiconductor dies 211 with bond pads 222 are attached on the die pads 212 with die attach material 218. Next, the metal bond wires 223 are formed to connect the bond pads 222 to leads 214. The encapsulation material 224 is then applied. See FIG. 7C. As shown in FIG. 7D the lead frame is inverted for placement on the stage 33 of the system 30 in order for a series of regions 229 along the dam bars 225 to be removed by laser ablation according to the invention. See FIG. 7E which illustrates exemplary void regions 229 formed in the dam bars 225.

In an expanded plan view of area B shown in FIG. 7E, an exemplary three-step laser ablation scanning process for isolation of the leads 214 is illustrated in FIGS. 8A-8E. As discussed above the heat affected zone can be minimized while providing high speed removal of material from the lead frame dam bars 225. FIG. 8A illustrates features of a dam bar 225 prior to ablation, including a central, flat section 226 having an upper surface 271 parallel with the die attach surface 216 and a lower surface 272. The upper surface 271 resides in a plane disposed below that of the surface 215. As previously noted, sloped sections 227 on each side of the flat section 226 extend to an adjoining surfaces 215 and 216 A region of encapsulating material 224a is formed above the dam bars 225.

In Step 1 cut areas 229 are formed on opposing sides of the dam bar flat section 226. The cut areas are formed to a depth $D_1$ in each of the associated sloped sections 227 as shown in FIG. 8B. In this set of cuts, encapsulation material is removed from the cut areas 229 to a depth $D_E$. As illustrated for this example, simultaneously, portions of the sloped sections 227 of the dam bars 225 may also be removed. The cut depth D1 is deeper than the maximum depth of encapsulation material 224a $D_E$ in the cut areas 229. This step may be completed in one pass with process settings which are determined based on the known ablation rate of the encapsulation material and the known depth $D_E$ from the Computer Aided Design (CAD) data file of the lead frame strip 100 stored in the computer system 44. Exemplary process settings for Step 1 are:

| | |
|---|---|
| Laser beam wavelength: | 355 nanometers |
| Laser beam power density: | 95 Joules/cm$^2$ |
| Pulse frequency: | 20 kHz |
| Pulse width: | 125 nanoseconds |
| Beam size: | 20 microns |
| Beam scan speed: | 0.024 meter/second |
| Scan overlap; | 10 microns |
| Number of passes: | typically 1-2 passes |

The ablation rate of the molding compound with the above process settings can be on the order of 200 microns per scan. Ablation of portions of the exemplary copper lead frame in Step 1 may be incidental or intended. With the above settings, and a single pass of the laser beam, the amount of the copper material removed may be on the order of 20 microns.

In Step 2, the remaining portions of the sloped sections 227 of the dam bar 225 are removed as the laser ablates materials to a depth $D_2$ as shown in FIG. 8C. $D_2$ is deeper than $D_S$, the maximum depth of the sloped section 227 of the dam bar 225 in the cut areas 229. In this step the power setting is increased to remove the lead frame material. The number of scan passes needed to ablate the metal to the depth D2 is determined from the known ablation rate of the lead frame material and the maximum depth $D_S$ from the Computer Aided Design (CAD) data file stored in the computer system 44. Process settings for Step 2 are:

| | |
|---|---|
| Laser beam wavelength: | 355 nanometers |
| Laser beam power density: | 190 Joules/cm$^2$ |
| Pulse frequency: | 25 kHz |
| Pulse width: | 125 nanoseconds |
| Beam size: | 20 microns |
| Beam scan speed: | 0.024 meter/second |
| Scan overlap; | 10 microns |
| Number of passes: | typically 5-6 passes |

With the modified settings, the ablation rate of an exemplary copper lead frame is on the order of 50 microns/pass.

In Step 3, additional encapsulation material 224b below the dam bar is removed to ensure the electrical isolation. The same process settings as described for Step 1 may be used in Step 3:

| | |
|---|---|
| Laser beam wavelength: | 355 nanometers |
| Laser beam power density: | 95 Joules/cm² |
| Pulse frequency: | 20 kHz |
| Pulse width: | 125 nanoseconds |
| Beam size: | 20 microns |
| Beam scan speed: | 0.024 meter/second |
| Scan overlap: | 10 microns |
| Number of passes: | typically 1-2 passes |

In Step 3, the encapsulation material 224b under the sloped section 227 of the dam bar 225 is removed to the depth $D_3$ as shown in FIG. 5D In FIG. 8D, $D_D$ is the maximum depth of the flat section 226 of the dam bar 225. The depth $D_3$ is greater than the depth $D_D$. The number of scan passes needed to ablate the metal to the depth D3 is determined from the known ablation rate of the encapsulation material 24b and the maximum depth $D_D$ provided by the CAD data file stored in the computer system 44. Settings of laser beam power, pulse frequency, and beam scan speed, and beam overlap are optimized for different package types and package parameters such as encapsulation material thickness, and the lead frame thickness. The isolation cut width with the above three-step isolation cut process is about 37 microns, but this may be varied in order to meet performance specifications of speed or cut width.

In another embodiment, Step 3 is modified to cut completely through the entire thickness of encapsulation material 224b positioned under the lead frame dam bar 225. When the isolation cut is made completely through the entire thickness T of the material 224b as shown in FIG. 8E, a simple optical inspection (manual or automated) can be performed to assure that isolation cuts meet the acceptance criteria. That is, with penetration of light from the bottom illumination element 43 through each cut region 229 provides the means of optical verification of the isolation with the imaging element 41 as schematically illustrated in FIG. 4.

In FIG. 9A, an optical microscope photo shows the isolation cuts 229 made completely through the entire thickness of encapsulation material 224b on each lead 214. The cuts sever each lead 214 from other leads and the associated dam bar 225. The width of the exemplary lead 214, measured along a direction transverse to the direction of the cuts 29 is about 300 microns and the width of the cut 229 is about 100 microns. The width of the cut 229 can be adjusted by the processing parameters. A cut width of 45 microns can be achieved with a 355 nanometer picosecond pulsed laser. Cut widths of less than 20 microns can be achieved with a 355 nanometer femosecond pulsed laser. By comparison, the cut width by mechanical sawing is more than 200 microns.

The dam bar 225, positioned between leads 214, is not visible due to the presence of encapsulation material 224a. FIG. 9B schematically illustrates the positions of isolation cuts 229 in relation to the sloped dam bar sections 227. The dam bar 225 is shown in hatched lines as it is embedded in the encapsulation material 224a shown in FIG. 9A. In FIG. 9C, an alternative method of lead frame isolation is illustrated wherein each lead 214 is isolated with a single long cut 229a and a plurality of cross or stitch cuts 229b orthogonal to or otherwise intersecting the long cut 229. As the cut speed is significantly faster for shorter cuts, replacing one of the long cuts 229 (FIG. 9B) with a plurality of short stitch cuts 229b can increase the lead isolation process throughput and reduce thermal stress from laser ablation. Further, as lead frame dimensions become smaller, narrower dam bars 225 can be isolated with this alternative method of providing one long transverse cut and a plurality of stitch or cross cuts (FIG. 9C).

The programmability and high flexibility of laser isolation cuts with the system 30 enables optimized design of isolation cuts for varying and complex geometries.

Figure 10:
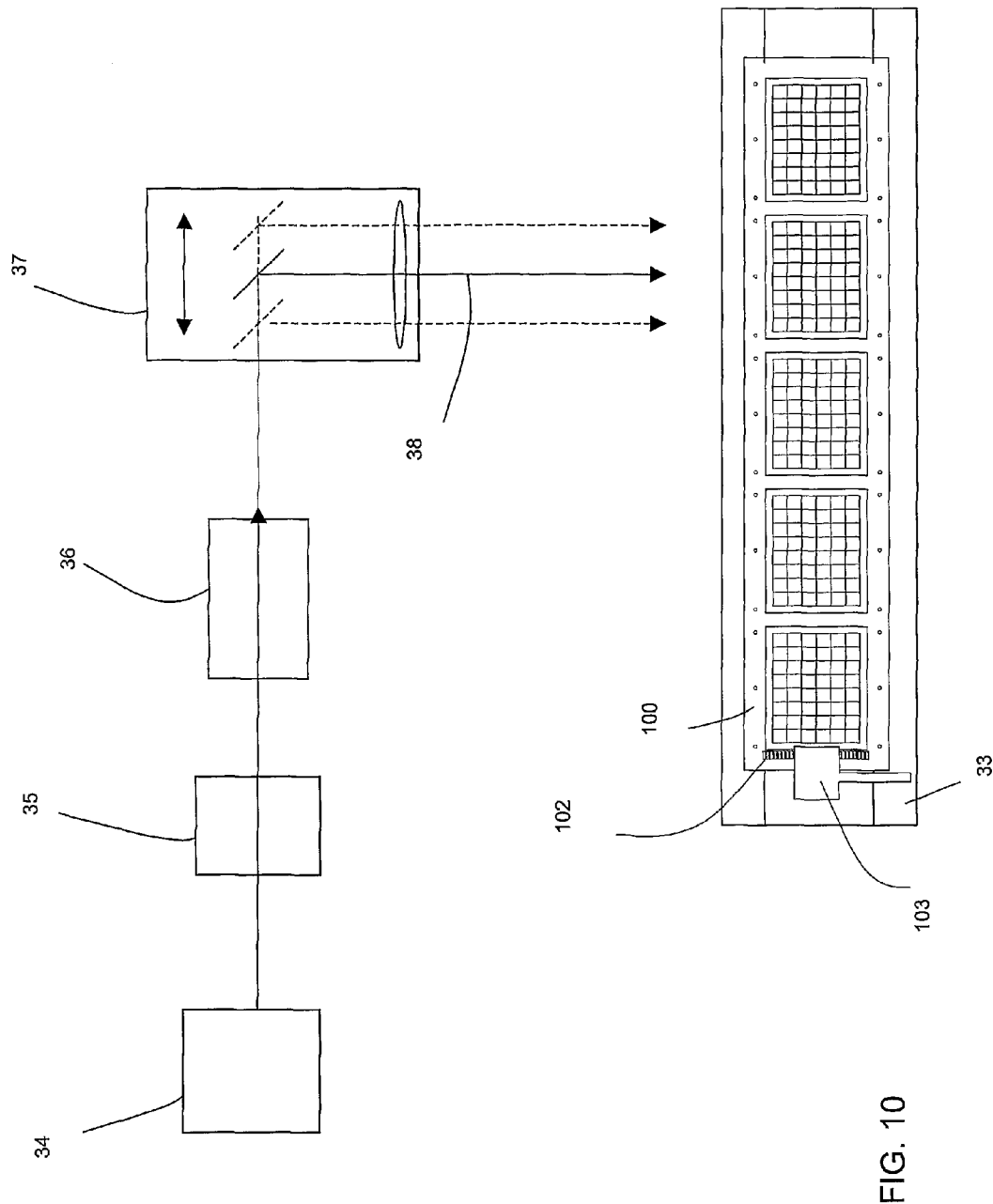
FIG. 10 schematically illustrates a configuration of the FIG. 4 system for beam scanning with a telecentric lens.

FIG. 10 is a simplified schematic illustration of exemplary operation of the system 30 to effect lead frame isolation by laser ablation. An encapsulated lead frame strip 100, i.e., after completion of molding and plating steps 304 and 305 in FIG. 6, is placed on the stage 33 for receipt of scanned laser radiation. A bar code scanner 103 on the stage 33 identifies the lead frame strip 100. The bar code information is processed in the controller 44 shown in FIG. 4 to import the appropriate CAD file from the data file interface 48 to memory 45 for the lead frame strip 100. Information in the lead frame data file includes essential information for effecting alignment and location of laser cuts, e.g., the geometry and location of components such as die pads 212, leads 214, dam bars 225, and fiducial markings such as the position alignment holes 101. Other information, including specifications or settings relating to removal of the encapsulation material 224 may be provided as well.

In a preferred embodiment, beam alignment is made using the imaging element 41. The imaging element 41 has a plurality of optical sensors such as CCD cameras to align and calibrate position information of the lead frame relative to the scanning path of the beam.

Figure 11:
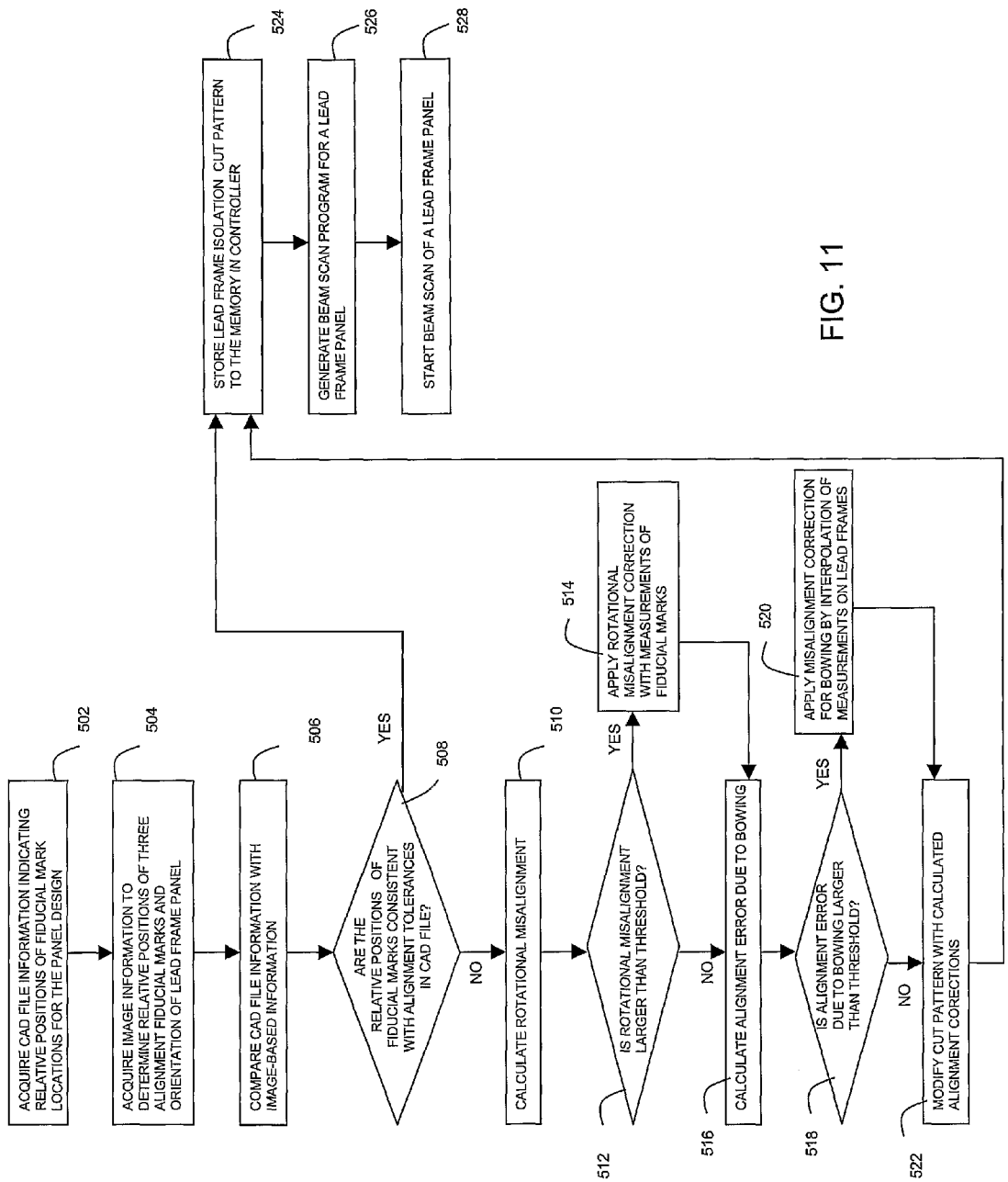
FIG. 11 is a flow chart illustrating an alignment process according to the invention.

In an embodiment of the invention, alignment correction further compensates for irregularities resulting from varied sources such as bowing and manufacturing tolerances. These corrections can be effected using three optical sensors in the imaging element 41 to measure the offset of each alignment hole position from the positions provided by the CAD data file. The beam trajectory is then adjusted with the offset information. First the images of the three position alignment holes 101 forming a triangle are captured. Next, coordinate or distance information obtained from the CAD file for the alignment holes 101 is compared with the captured image information to determine the alignment correction for rotational misalignment. Additional comparison of images and CAD files can be made on a number of lead frames across the panel to determine an alignment correction for bowing. Non-linear alignment corrections can be developed by interpolation to generate new cut patterns. The adjusted CAD file information with alignment corrections is used to program the scanning routines in each of the isolation cut Steps 1, 2 and 3. FIG. 11 is an exemplary flow chart illustrating a process for determining need for alignment compensation in accord with the afore-described embodiment of lead frame panel alignment correction.

In another embodiment, select features such as leads on each unit lead frame 120 are used for alignment of each unit lead frame 120. This enables a precision cut of individual unit lead frames 120 when a severe warpage of the lead frame strip 100 exists from previous processing steps or is created during the isolation cut. FIGS. 12A-12F illustrate the alignment method for each lead frame.

Figure 12A:
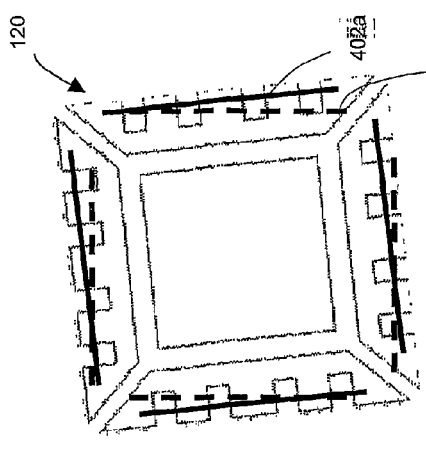
FIGS. 12A-12F illustrate various stages of alignment of a lead frame with respect to isolation cut patterns.
Figure 12B:
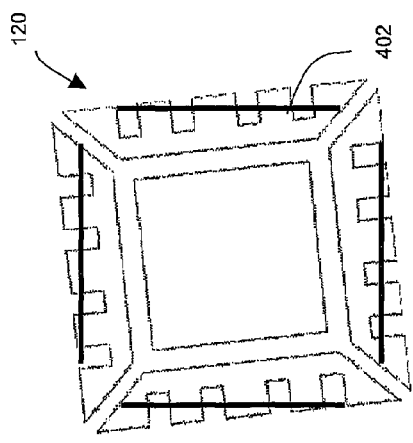
Figure 12C:
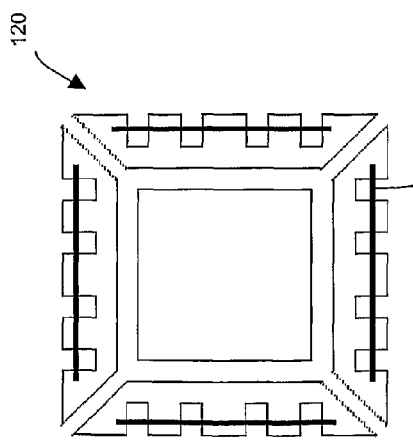
Figure 12D:
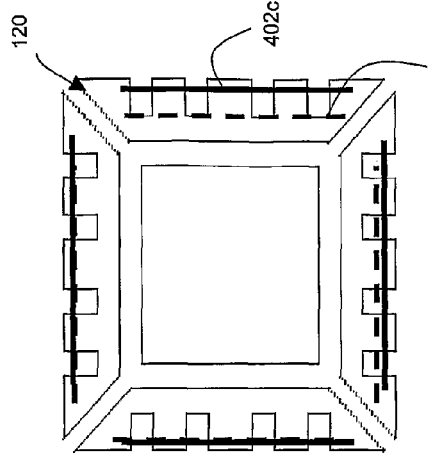
Figure 12E:
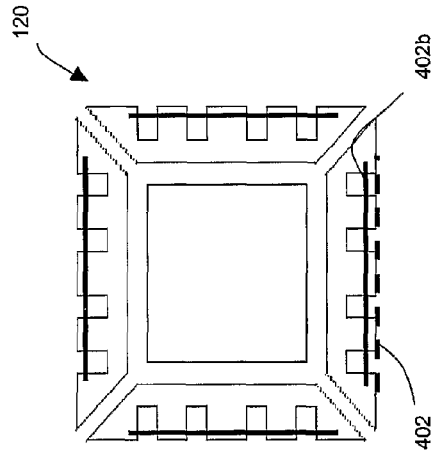
Figure 12F:
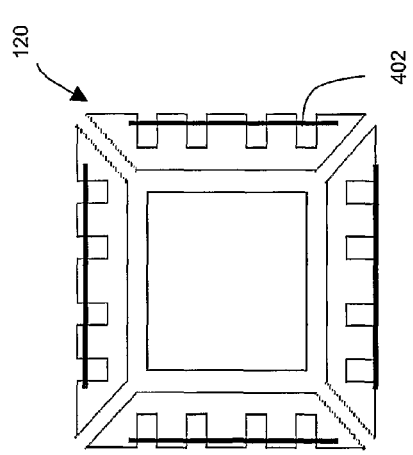

In FIG. 12A, the lead frame 120 is satisfactorily aligned with the isolation cut program normally generated based on a CAD file. This is shown as pairs of parallel cut lines 402 forming a square-like pattern along the four sides of the lead frame. In FIG. 12B the lead frame 120 is rotationally misaligned with respect to cut lines 402. FIG. 12C illustrates the rotational correction made to the cut program with the corrected cut lines 402a in order to accommodate the misalignment of FIG. 12B. The original cut lines 402 are shown with phantom lines as references. In FIG. 12D, a misalignment due to bowing is illustrated. While FIG. 12E illustrates correction made to the cut program in order to make correct cuts in the lead frame of FIG. 12D by moving, for example, a cut from position A (cut line 402) to position A' (cut line 402b). FIG. 12F illustrates the correction made for a combined misalignment due to rotational element and bowing with corrected cut lines 402c. The original cut lines 402 are also shown as references.

A sequence of alignment steps and beam scans is programmed into the computer system based on information in the CAD file in order to define the scan paths, shuttering and the expected number of cuts needed for electrical isolation of the leads 214 in each lead frame panel 110 on the lead frame strip 100. Variations in positions of features on the lead frame strip 100, resulting from manufacturing tolerances, thermal expansion and bowing of the strip, are accommodated by programming the scanning routine based on fiducial information. To address these, translations, rotations and non-linear scaling relative to alignment marks and the focal plane are effected by comparing data from the CAD file with, for example, image data of the lead frame strip generated by the imaging element 41. The vision system includes the imaging element 41, frame grabbing cards and image processing software reside in the controller 44.

The System 30 performs multi-pass high speed laser ablation along multiple dam bars 225 without damaging other features on the lead frame strip. This is enabled with the combination of high speed beam shuttering and high speed beam scanning. With the beam scan head 37, high speed scanning can accurately position the laser beam along a path for isolation of the leads 214 with better than 0.5 micron beam positioning accuracy. This is enabled with a pair of galvanometers. A telecentric lens enables scanning of a fixed focus beam while maintaining an orientation normal to the surface of the lead frame strip 100. In this embodiment, the lens, positioned in the scan head, remains stationary as galvanometers sweep the beam across the lens to scan the along the work-piece. The laser beam always exits the lens in a direction parallel to the optical axis. The focal length of the lens does not change during the scan.

Once the starting point for the laser ablation is selected with the compensated CAD data file, the laser beam 38 moves in a programmed pattern along a first axis. Electrical isolation of each unit lead frame 120 can be performed with four sets of cuts, two sets being along the x-axis and the other two along the y-axis. In one embodiment, all x-axis cuts in the array can be made sequentially, followed by the sequence of all y-axis cuts. The sequence can be reversed. An exemplary cut pattern is schematically illustrated in FIG. 13 with isolation sections $x_{11}$-$x_{87}$ and $y_{11}$-$y_{96}$. Each of the isolation sections $x_{11}$ to $y_{96}$ represents two isolation cuts 227 and 229 for each dam bar 225 as shown in FIG. 9B. When the laser beam 38 travels between the two sections which are to receive ablation, its path is blocked by operation of the beam shutter element 35. In FIG. 12, the first ablation pass starts at $x_{11}$ and continues along the x-axis to $x_{81}$. Then it moves down to $x_{82}$ and sweeps to $x_{12}$. This back and forth scan pattern continues until a scan is made through $x_{87}$. Then the beam may return to $x_{11}$ to start the second pass. This sequence completes the isolation of one set of leads at each isolation section from $x_{11}$ to $x_{87}$. In order to isolate the other set of leads at each isolation section from $x_{11}$ to $x_{87}$, the above ablation passes are repeated with necessary offsets. After the isolation cuts along the x-axis are complete, isolation cuts along the y-axis start at $y_{11}$ and continue to $y_{96}$ The ablation process settings for each pass are pre-programmed based on stored information specific to the design of the lead frame strip 100. Numerous other patterns and sequences for performing the cuts are possible. The system 30 can also be programmed to perform cuts 229a and 229b, such as described with reference to FIG. 9C.

During and at the conclusion of a cut process on a lead frame strip, the operator can observe the real-time isolation cut process via the vision system in order to monitor and control the isolation cut process. The bottom illumination element 43 enables in-situ monitoring and recognition of the end-point to isolation, e.g., when a complete cut through the mold compound is employed in the last cut step. The vision system can be used to compare each cut to a pass/fail standard. Incomplete cuts can be reworked before moving the strip from its alignment position on the stage 33. An electrical probing system can also be incorporated to confirm the electrical isolation, e.g., by probing pairs of adjacent leads 214 on opposing sides of dam bars 214 to assure that they have been sufficiently severed by ablation.

Figure 14:
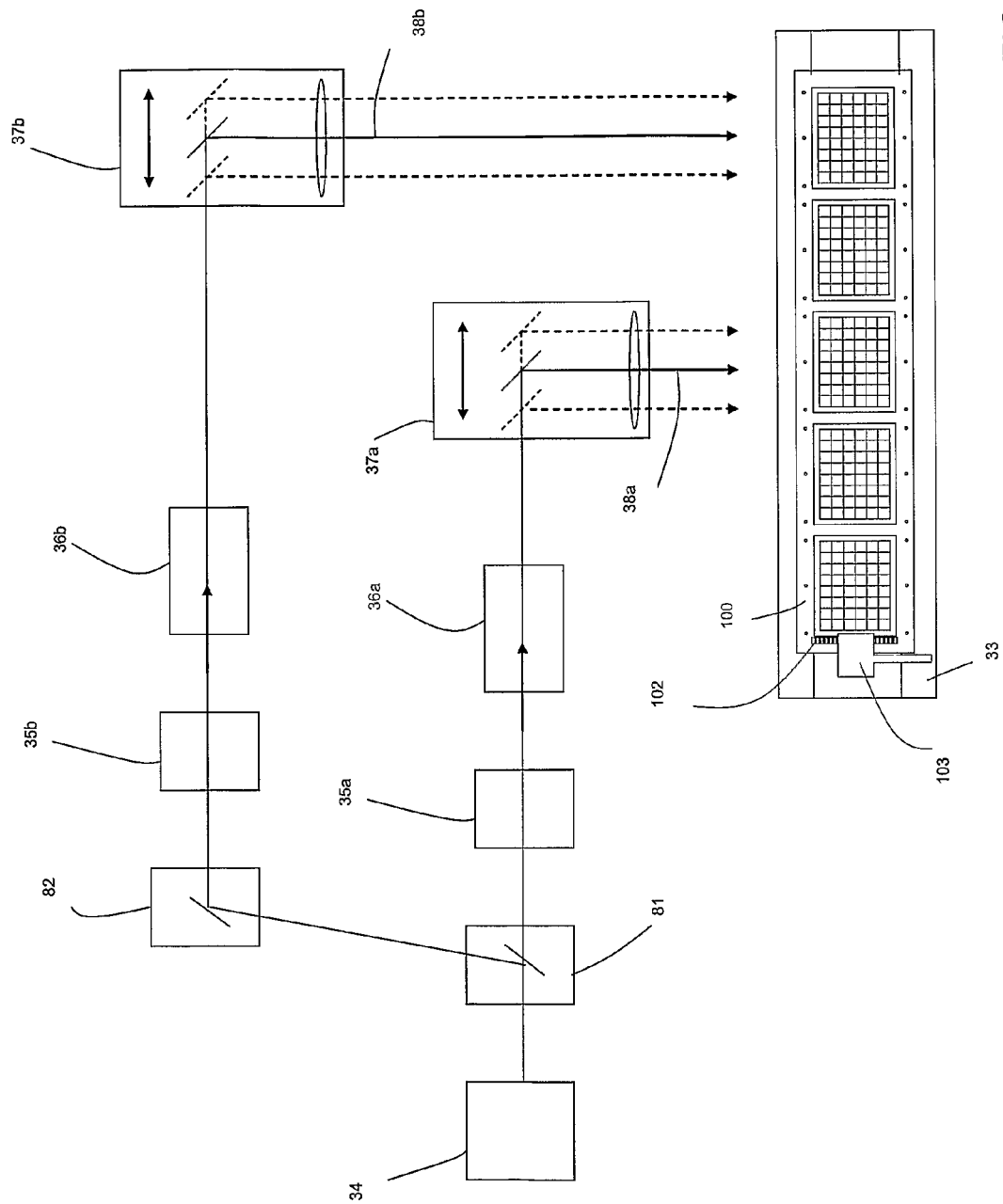
FIG. 14 illustrates an alternative embodiment according to the invention.

In another configuration of the system 30, a laser beam from a laser 34 can be split with a beam splitter 81 and a reflection element 82 to generate two laser beams 38a and 38b as illustrated in FIG. 14. The two beams may each be provided with a separate beam shutter element 35a and 35b, a separate beam focus element 36a and 36b, and a separate beam scan element 37a and 37b. Alternately, relying on symmetry of the lead frame arrays, certain ones of the foregoing components may be shared by being positioned before the beam splitting. Using two laser beams 38a and 38b, dam bars in the same lead frame array or in different arrays can simultaneously receive ablation energy to effect isolation of multiple groups of conductive leads simultaneously, thereby doubling the throughput of the system 30.

In another configuration of the system 30, a plurality of laser sources 34 can be provided to generate multiple laser beams 38 to further improve the throughput of the system 30.

As the package geometry continues to shrink, electrical isolation of leads in lead frame packages will require finer resolution. Better resolution can be provided with a laser ablation method by selecting shorter wavelength and shorter pulse width. The present invention discloses a laser ablation system 30 which is capable of making isolation cuts in multiple sites at high speed and high resolution. With high isolation resolution and capability of handling complex geometries, the system 30 can be used for other electrical isolation applications or singulation of various types of packages after functionality test.

A feature of the invention is provision of a laser ablation method and a system for electrical isolation of lead frame conductors for strip testing that delivers high processing yield and high throughput. High processing yield has been demonstrated with an alignment method that employs a multi-point overlay of image data with template data; and with process settings which minimize overheating of the lead frame strip. Exemplary processes limit the size of the heat affected zone during laser ablation to mitigate formation of micro-cracks in the encapsulation material and limit generation of conductive debris. Recognizing that micro-cracks can provide paths for diffusion of metallic elements that degrade the package reliability, laser ablation processes according to the invention can result in improved reliability relative to conventional isolation processes, e.g., mechanical sawing. Processes according to the invention can also limit overheating which would lead to further warpage of the lead frame strip, affecting both the quality and alignment of isolation cuts.

A high throughput, high speed beam delivery system has been disclosed, having a telecentric, fixed focus scanning arrangement in combination with a high speed beam shutter. Other configurations may also provide sufficient performance and will be apparent to those skilled in the art. For example, in lieu of a mechanical shutter arrangement, power switching and other blanking methods may be employed to limit ablation to designated areas during a beam scan. Optical sensors and multiple illumination elements provide the ability to monitor the process, inspect the work piece after the isolation cut is made and perform additional cutting when necessary.

While various embodiments of the present invention have been shown, it will be obvious that such embodiments are provided by way of example only. Numerous variations, changes and substitutions may be made without departing from the invention, which is only limited by the claims which follow.

I claim:

1. A system for electrically isolating conductive members of a plurality of lead frames from one another, the system comprising:
    a stage configured to position the plurality of lead frames to receive laser radiation;
    a laser configured to emit laser radiation;
    a computer system comprising electro-optical components configured to sever conductive members from one another by laser ablation effected with programmable scanning of light from the laser;
    memory comprising instructions that when executed cause a system to effect ablation paths along a plurality of lines across an array of lead frames, so that the ablation occurs:
        in spaced-apart segments along lines oriented along a first direction to sever at least one lead associated with the lead frames while leaving the lead frames attached to one another, and
        in spaced-apart segments along lines oriented along a second direction not parallel with the first direction to sever other leads while still leaving the lead frames attached to one another so that the array can undergo electrical testing prior to singulation.

2. The system of claim 1, further comprising:
    a machine-accessible, non-volatile storage medium including instructions that when executed cause a system to:
    establish ablation paths along the array based on:
        (i) stored information descriptive of the array, including a set of predetermined ablation paths, and
        (ii) adjustment of the predetermined ablation paths relative to fiducial markings on a sheet comprising the plurality of lead frames to compensate for misalignment of features in the array as described by the stored information.

3. The system of claim 1, wherein the instructions are configured to effect ablation paths which sever adjacent conductors in a lead frame from an associated dam bar while not ablating metal associated with die pad tie bars in order retain the lead frames in an interconnected array.

4. The system of claim 1, further comprising:
    a second laser configured to emit laser radiation and additional electro-optical components to simultaneously perform laser ablation on multiple lead frames to electrically isolate multiple, spaced apart groups of conductive leads.

5. The system of claim 4, wherein the electro-optical components are configured to split radiation emanating from the laser to create two laser beams.

6. The method of claim 1, further comprising:
    simultaneously testing more than one of the plurality of lead frames prior to singulation.

7. A method for electrically isolating conductive members in a lead frame array, the array formed on a sheet having a plurality of interconnected lead frames, the method comprising:
    providing reference information describing geometric features, said reference information including predefined laser ablation scan paths associated with a particular lead frame array design;
    locating fiducial markings on the sheet; and
    performing laser ablation on conductive members based upon the located fiducial markings and the predefined scan paths; and
    electrically isolating conductive members associated with a first lead frame from conductive members associated with a second lead frame by severing at least some of the conductive members from associated dam bars.

8. The method of claim 5, further comprising:
    removing encapsulation material formed on the array of lead frames along cuts via laser ablation; and
    transmitting light through the cuts;
    determining whether the transmitted lights transmits through the cuts; and
    controlling the laser based upon transmission of the light through the cuts.

9. The method of claim 7, further comprising:
    simultaneously testing more than one of the plurality of lead frames prior to singulation.

10. A laser ablation method for electrically isolating conductive members formed on each side of a dam bar in a lead frame array, the array being of the type formed on a sheet having a plurality of interconnected lead frames through an integrally formed dam bar, a plurality of the dam bars extending in a first direction with conductive members formed on each side, the conductive members extending in a second direction transverse to the first direction, the method comprising:
    applying a laser to cut through a first dam bar in the first direction; and
    applying the laser to cut through the first dam bar on each side of each associated conductive member.

11. The method of claim 10, further comprising:
    applying the laser to cut through all others in the plurality of dam bars in the first direction; and
    applying the laser to cut through all others in the plurality of dam bars on each side of the associated conductive members.

12. The method of claim 10, further comprising:
    simultaneously testing more than one of the plurality of lead frames prior to singulation.

13. A method for electrically isolating conductive members in a lead frame array, the array being of the type that is formed on a sheet having a plurality of interconnected lead frames, the method comprising:
    providing reference information describing geometric features, said reference information including predefined laser ablation scan paths for performing cuts along predefined cut lines on each lead frame, which cut lines are specific to the lead frame array design;
    locating fiducial markings on the sheet;
    determining whether to apply the predefined laser ablation scan paths to effect cuts along the predefined cut lines by comparing relative positions of the fiducial markings to the reference information;
    adjusting the scan paths based on the extent of deviation between the relative positions and the reference information;

applying a laser to cut through a first dam bar in the first direction; and applying the laser to cut through the first dam bar on each side of each associated conductive member.

14. The method of claim 13, wherein the step of adjusting the scan paths further includes shifting an angle characteristic of one of the predefined scan paths to define a new scan path aligned with the predefined cut lines.

15. The method of claim 13, wherein the step of adjusting the scan paths further includes scaling of reference information associated with the predefined scan paths.

* * * * *